United States Patent [19]

Stitt

[11] 4,121,168

[45] Oct. 17, 1978

[54] OPTICALLY COUPLED BIAS CIRCUIT FOR COMPLEMENTARY OUTPUT CIRCUIT AND METHOD

[75] Inventor: Robert M. Stitt, Tucson, Ariz.

[73] Assignee: Burr-Brown Research Corporation, Tucson, Ariz.

[21] Appl. No.: 827,212

[22] Filed: Aug. 24, 1977

[51] Int. Cl.² ............................................. H03F 3/21
[52] U.S. Cl. .................................... 330/265; 330/59; 330/268
[58] Field of Search ................. 330/59, 265, 267, 268, 330/308; 307/311

[56] References Cited

U.S. PATENT DOCUMENTS

| 3,434,066 | 3/1969 | Huntley | 330/268 |
|---|---|---|---|
| 3,529,252 | 9/1970 | Long | 330/265 |
| 3,529,254 | 9/1970 | Hill | 330/268 |
| 3,553,599 | 1/1971 | Hayamizu | 330/285 |
| 3,629,717 | 12/1971 | Bisgaard | 330/268 X |

*Primary Examiner*—James B. Mullins
*Attorney, Agent, or Firm*—Cahill, Sutton & Thomas

[57] ABSTRACT

A complementary transistor output circuit and method incorporates an optical coupler including a light emitting diode and a phototransistor connected between the base electrodes of a complementary pair of output transistors including a PNP transistor and an NPN transistor. The emitter of each of the output transistors is connected to an output of the output circuit. The base electrodes of the PNP output transistor and the NPN output transistor are connected, respectively, to first and second current source circuits. The collector electrode of the NPN output transistor is coupled by means of a first feedback circuit including a first resistor and a PNP transistor to the anode of a light emitting diode. The collector electrode of the PNP output transistor is coupled by means of a second feedback circuit to include a second resistor and an NPN transistor to the cathode of the light emitting diode. A phototransistor operates to effectively shunt base drive current supplied by the two current source circuits to the PNP and NPN output transistors to establish a bias voltage, and to maintain a constant quiescent bias current through the output transistors. The magnitude of the quiescent bias current is determined by the resistances of the first and second resistors and by the base-to-emitter voltages of the transistors in the first and second feedback circuits. The method of the invention includes sensing an increase in the bias current in one of the output transistors, increasing the current through the light emitting diode in response to the increase in the bias current, and directing the emitted light to the base of the phototransistor to decrease the bias current.

15 Claims, 4 Drawing Figures

OPTICALLY COUPLED BIAS CIRCUIT FOR COMPLEMENTARY OUTPUT CIRCUIT AND METHOD

BACKGROUND OF THE INVENTION

1. Field of the Invention

The invention relates to complementary transistor amplifier output stages, and relates more particularly to circuits for maintaining constant bias current through the output transistors of the complementary transistor output stage to reduce or eliminate crossover distortion.

2. Brief Description of the Prior Art

Complementary transistor amplifier output stages including an NPN output transistor and a PNP output transistor coupled in series between two power supply voltages are well known. Biasing schemes to produce a bias voltage between the bases of the NPN output transistor and the PNP output transistor in order to maintain a bias current in the PNP and NPN output transistors are also known. Such bias currents are highly desirable in order to provide high fidelity output signals with a minimum amount of crossover distortion. Crossover distortion occurs when the voltage produced by the bias circuit does not properly match the emitter-to-base voltage drops of the output transistors. One common bias circuit consists essentially of compensating diodes connected in series between the base electrodes of the NPN and PNP output transistors. The bias voltage provided by that bias circuit is not readily adjustable. The forward voltage drop of the diodes must be carefully matched to the emitter-base voltages of the output transistors (hereinafter called "$V_{BE}$ voltages") in order to effect proper operation. Although the above diode bias circuit produces a quiescent bias circuit through the complementary output transistors, a serious "thermal runaway" problem may occur if one of the NPN or PNP output transistors heats up as a result of, for example, delivering a large signal current to a load connected to the output. The thermal runaway problem occurs because the emitter-base PN junction of that one of the output transistors heats up rapidly. Since the $V_{BE}$ voltage of a bipolar transistor decreases with temperature, the heating up of the emitter-base junction with a constant $V_{BE}$ bias voltage applied thereto causes yet more quiescent bias current to flow through the transistor, which in turn causes still further heating of the emitter-base junction. If there is no mechanism or element to limit the current, catastrophic failure of the emitter-base junction occurs. Thermal feedback between the output transistor and the diodes in the diode bias circuit may have a long time constant and poor $\Delta V_{BE}/\Delta T$ matching to the output transistors, where $\Delta T$ is the change in junction temperature of the diodes. Consequently, known diode bias circuits are relatively inadequate in compensating for the temperature-caused decrease in the $V_{BE}$ voltage of the output transistors as the temperature of the output transistors increases. Another known biasing circuit called a $V_{BE}$ multiplier has been connected between the bases of the PNP and NPN complementary output transistors to maintain a bias current therein. A typical $V_{BE}$ multiplier circuit includes an NPN transistor having a resistor connected between its base and collector and another resistor connected between its base and emitter. Although the $V_{BE}$ multiplier may be adjusted (by adjusting the resistor values) to provide a desired bias current in the PNP and NPN complementary output transistors, it nevertheless has generally the same poor thermal tracking and $\Delta V_{BE}/\Delta T$ matching problems as the above-described diode bias circuit. If constant bias current is to be maintained in the NPN and PNP output transistors, the bias voltage must also decrease with junction temperature of the output transistor at the same rate as the $V_{BE}$ voltages of the output transistor. The thermal feedback schemes of the prior art, which involve approaches such as using a common heat sink for the biasing circuit and the output transistors, do not satisfactorily maintain a constant bias current. Regenerative increasing of the bias current and output transistor junction temperature may result in catastrophic failure of the output stage.

SUMMARY OF THE INVENTION

It is an object of the invention to provide a complementary transistor output stage including a bias circuit which establishes a bias current through the output transistors which is substantially constant and is dependent on circuit design values and independent of matching of transistors and/or diodes.

Another object of the invention is to provide a complementary transistor output stage which eliminates thermal runaway.

It is another object of the invention to provide a complementary output stage which has a low level of crossover distortion.

It is another object of the invention to provide a complementary transistor output stage which has a constant bias current to reduce crossover distortion at high output signal current.

It is another object of the invention to provide a complementary transistor output stage having a quiescent bias current in the output transistors which is substantially independent of variations in power supply voltage.

Briefly described, the invention is a complementary transistor output stage including a first output transistor of a first conductivity type and a second output transistor of a second conductivity type. Each of the output transistors has, respectively, first and second current-carrying electrodes and a control electrode. The first current-carrying electrode of each of the output transistors is coupled to an output of the complementary transistor output stage. An input of the complementary transistor output stage is coupled to the control electrodes of the first and second output transistors. A bias circuit coupled between the control electrodes and the two output transistors and responsive to current through the output transistors maintains a bias current through the output transistors which is substantially constant. In one presently preferred embodiment of the invention negative feedback from the collectors of the complementary output transistors controls an optical coupler in the bias circuit.

DESCRIPTION OF THE INVENTION

Figure 1:
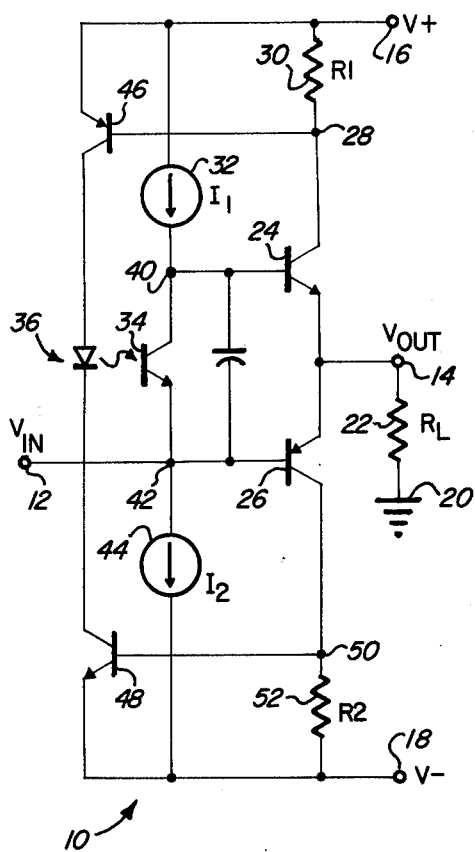
FIG. 1 is a schematic drawing of a presently preferred embodiment of the invention.
Figure 3A:
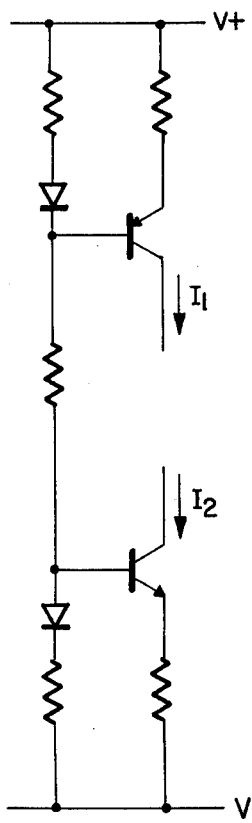
FIGS. 3a and 3b are schematic diagrams of circuitry which may be used to implement current sources 32 and 44 of FIG. 1.
Figure 3B:
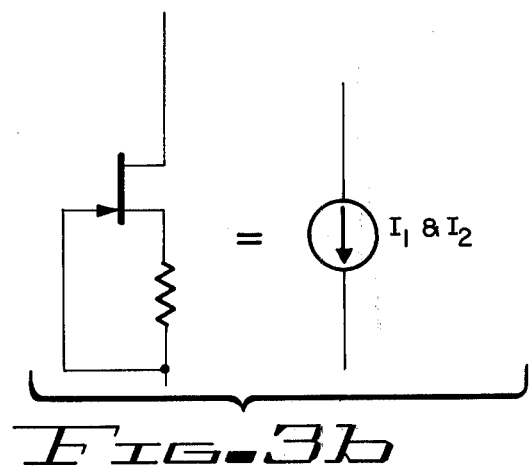

The circuit schematically shown in FIG. 1 is a class "AB" complementary transistor output stage 10. NPN output transistor 24 and PNP output transistor 26 are connected as a complementary output pair. The emitters of transistors 24 and 26 are connected to output terminal 14, which drives a load represented by resistor 22. Input terminal 12 is connected to node 42, which is connected to the base of PNP output transistor 26. An optical coupler including light emitting diode 36 and phototransistor 34 operates in response to negative feedback from the collectors of output transistors 24 and 26 to accurately establish the DC or quiescent bias current through output transistors 24 and 26. Current source circuit 32 is coupled between V+ conductor 16 and the base of NPN output transistor 24. Current source circuit 44 is connected between the base of PNP transistor 26 and V− conductor 18. A wide variety of constant current source circuits may be used to implement current source circuits 32 and 44 may be found in textbooks and technical journals. Several exemplary circuits which may be utilized to implement current source circuits 32 and 44 are shown in FIGS. 3a and 3b. Those skilled in the art will readily understand their operation and advantages, so further discussion is unnecessary.

NPN phototransistor 34 has its collector connected to the base of NPN output transistor 24 and its emitter connected to the base of PNP output transistor 26. The resistor 30 has resistance $R_1$ and is connected between V+ and the collector of NPN output transistor 24. PNP control transistor 46 has its base connected to node 28, its emitter connected V+ and its collector connected to the anode of light emitting diode 36. Resistor 52 has resistance $R_2$ and is connected between V− and node 50. NPN control transistor 48 has its emitter connected to V−, its base connected to node 50, and its collector connected to the cathode of light emitting diode 36. A compensation capacitor 38 having capacitance sufficiently high to produce a large time constant for any change in voltage difference between nodes 40 and 42 compared to the period of any applicable signal frequencies at nodes 40 and 42. A typical value for capacitor 38 would be in the range of 10 microfarads.

The operation of the complementary output stage of FIG. 1 is such that if no input signal is applied a current equal to $V_{BE(46)} \div R_1$ flows through resistor 30, where $V_{BE(46)}$ is the emitter-to-base voltage of PNP control transistor 46. Similarly, the current through resistor 52 is $V_{BE(48)} \div R_2$.

In order to understand the quiescent operation of complementary transistor output stage 10, it is helpful to consider its operation as the power supply voltages on conductors 16 and 18 are respectively increased from ground to V+ and decreased from ground to V−, respectively, under the assumed condition that the resistance of load 22 is infinite, so that there is no output current. Initially, control transistors 46 and 48 are off. Light emitting diode 36 and phototransistor 34 are also off. Current source 32 drive current $I_1$ into the base of NPN output transistor 24 and current source 44 drives current $I_2$ from the base of PNP output transistor 26. This causes current to flow through resistor 30 and resistor 52. Either transistor 46 or transistor 48 (it does not matter which one) is turned on first by the voltage across $R_1$ or $R_2$. At this point no current flows through light emitting diode 36, since the other one of transistors 46 or 48 is still off. Phototransistor 34 therefore remains off. Finally, the other one of transistors 46 or 48 is turned on. This causes current to flow through light emitting diode 36, causing it to emit light which turns phototransistor 34 on, which in turn causes a portion of each of base drive currents $I_1$ and $I_2$ to be shunted, reducing the voltage difference between nodes 40 and 42. This causes the current flow through transistors 24 and 26, which is the quiescent bias current, to be equal to the larger of the currents through resistor 30 or resistor 52, under no load conditions. The values of $R_1$ and $R_2$ are therefore chosen to provide a value of quiescent bias current which adequately reduces crossover distortion at the output of complementary transistor output stage 10. For example, a typical value of quiescent bias current might be 50 milliamperes. It may be seen that the circuitry including resistor 30, PNP control transistor 46, light emitting diode 36, and phototransistor 34 forms a first negative feedback path from the collector of NPN output transistor 24 to the base of NPN output transistor 24, while the circuitry including resistor 52, NPN control transistor 48, light emitting diode 36, and phototransistor 34 forms a second negative feedback path from the collector of PNP output transistor 26 to the base of NPN output transistor 26.

In essence, phototransistor 34 operates as a feedback controlled voltage source which adjusts the voltage between nodes 40 and 42 to whatever value is necessary to provide the correct amount of bias current through output transistors 24 and 26 in response to negative feedback from the feedback paths through light emitting diode 36 and phototransistor 34. The value of capacitor 38 is chosen so that the time constants at the base electrodes of transistors 24 and 26 are adequate to maintain loop stability.

Optical couplers such as the one including light emitting diode 36 and phototransistor 34 are readily commercially available. Alternate optical couplers might also be used, such as one with a photoresistor in place of phototransistor 34.

The operation of complementary transistor output stage 10 is such that if the voltage applied to input terminal 12 is increased, phototransistor 34, aided by capacitor 38, act to maintain a substantially constant voltage between nodes 40 and 42. However, the base-to-emitter voltage of NPN output transistor 24 increases enough to cause a correspondingly increased amount of output current to flow through NPN output transistor 24 and through load resistor 22 to ground. The current through $R_1$ increases, thereby increasing the base-to-emitter voltage of control transistor 46, causing transistor 46 to saturate. However, the current flowing through resistor 52 remains unchanged, and therefore the current flowing through both control transistor 48 and light emitting diode 36 also remains unchanged, and consequently the shunting current through phototransistor 34 also remains unchanged. Phototransistor 34 shunts exactly enough current into current source circuit 44 to permit enough base current to flow out of the base of PNP output transistor 26 to maintain the quiescent bias current through PNP output transistor 26 at a value equal to $V_{BE(48)} \div R_2$. This same quiescent bias current will also, of course, flow through NPN output transistor 24 in addition to the increased signal current also flowing through NPN output transistor 24 as a result of increasing the voltage at input terminal 12. It is therefore seen that as $V_{IN}$ increases, resistor 52 and NPN transistor 48 are the control elements in establishing the quiescent bias current through output transistors 24 and 26, and that the quiescent bias current is independent of the output current of complementary transistor output stage 10.

Similarly, if $V_{IN}$ decreases, an increased amount of current flows from ground through load resistor 22 and through PNP transistor 26. In this case, NPN control transistor 48 saturates because of the increased voltage across $R_2$. In this case, PNP transistor 46 controls the amount of current flowing through light emitting diode 36, and the bias current flowing through transistors 24 and 26 is $V_{BE(46)} \div R_1$, and is independent of the output current.

It should be readily recognized that complementary transistor output stage 10 provides a quiescent bias current through output transistors 24 and 26 which is completely independent of changes in the emitter-base junction temperature of either of the output transistors 24 and 26. Therefore, the circuit of FIG. 1 avoids the thermal runaway problems which characterize the complementary output circuits of the prior art, and provides a substantially constant level of bias current and commensurately low level of crossover distortion. The electronic feedback described above results in excellent "tracking" of the bias voltage produced between nodes 40 and 42 with respect to emitter-base junction temperature variations, power supply variations, and variations in output current. Thermal runaway is therefore avoided, and a constant level of bias current and low level of crossover distortion is achieved.

In summary, it may be seen that the quiescent bias current of the circuit of FIG. 1 is independent of load current and of temperature of the output transistors. The output current flows through only one output transistor at a time, and the quiescent bias current is established by means of electronic feedback from the collector to the base of the other output transistor. If the current through one of the output transistors increases due to heating up of its emitter-base junction, the proper quiescent bias current is maintained through the other output transistor. It is therefore clear that the bias current is completely independent of matching of the transistors or other devices.

It should be noted that the current source circuits 32 and 44 may be implemented as resistors or as gain stages, or by means of the conventional current source circuits shown in either FIG. 3a or FIG. 3b.

Figure 2:
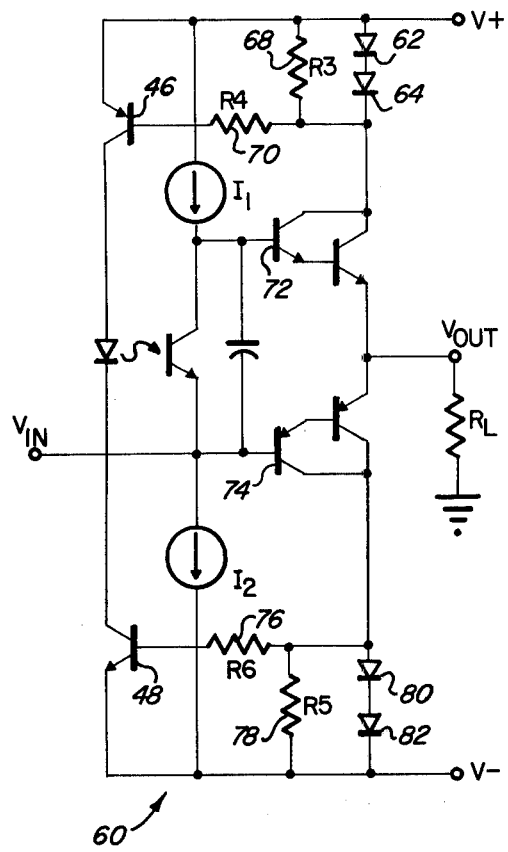
FIG. 2 is a schematic diagram of an alternate high current embodiment of the invention.

The output transistors 24 and 26 of FIG. 1 may be replaced by Darlington stages to obtain increased current gain in the output stage, as shown in FIG. 2. The circuit of FIG. 2 also permits use of lower cost, low current transistors for control transistors 46 and 48 by providing high current diodes 62, 64, 80, and 82 and resistors 70 and 76. This is because the amount of output current in excess of the sum of the forward voltage drops of diodes 62 and 64 divided by $R_3$ flows through diodes 62 and 64, rather than through the emitter-base junction of control transistor 46.

I claim:

1. A complementary transistor output circuit having an output and an input and comprising:
   (a) a first output transistor of a first conductivity type having first and second electrodes and a control electrode;
   (b) a second output transistor of a second conductivity type having first and second electrodes and a control electrode, said first electrode of said first transistor being coupled to said first electrode of said second transistor and being also coupled to said output, said input being coupled to said control electrode of both said first and second transistors; and
   (c) means electrically responsive to an output current component through one of said output transistors and coupling said first and second control electrodes for biasing said first and second output transistors to produce a bias current component in said first and second transistors which is substantially independent of any variations in said output current component through said one of said output transistors, including any variations in said output current caused by temperature variations in said one of said output transistors.

2. The complementary transistor output circuit of claim 1 wherein said biasing means includes an optical coupler responsive to currents in said first and second output transistors and coupled to said first and second control electrodes of said first and second output transistors for reducing a voltage difference between said first and second control electrodes in response to an increase in the magnitude of said bias current.

3. The output circuit of claim 2 wherein said first output transistor is a PNP output transistor and said second output transistor is an NPN output transistor, the control electrode of each of said output transistors being its base electrode, the first electrode of each of said output transistors being its emitter electrode, and the second electrode of each of said output transistors being its collector electrodes.

4. The complementary transistor output circuit of claim 3 wherein said input is directly connected to said base of said first output transistor.

5. The complementary transistor output circuit of claim 4 wherein said optical coupler includes a light emitting diode and a phototransistor positioned with respect to said light emitting diode so that light emitted by said light emitting diode is received by said phototransistor to cause current to flow from the collector of said phototransistor to the emitter of said phototransistor and wherein said phototransistor is coupled between said base electrodes of said first and second output transistors.

6. The complementary transistor output circuit of claim 5 wherein said biasing means includes first feedback means coupled between the collector of said NPN output transistor and the anode of said light emitting diode for increasing the voltage at said anode of said light emitting diode in response to an increase in the collector current of said NPN transistor, and wherein said complementary transistor output stage further includes second feedback means coupled between the cathode of said light emitting diode and the collector of said PNP output transistor for reducing the voltage of said cathode in response to the increase in the magnitude of the current flowing in the collector of said PNP output transistor.

7. The complementary transistor output circuit of claim 6 wherein said first feedback means includes a PNP control transistor having its emitter coupled to a positive voltage conductor and its collector connected to said anode of said light emitting diode and its base coupled to the collector of said NPN output transistor, and wherein said second feedback means includes an NPN control transistor having its collector connected to said cathode of said light emitting diode, and its base coupled to the collector of said PNP output transistor.

8. The complementary transistor output stage of claim 7 further including a first resistor and a pair of series-coupled diodes coupled in parallel between a collector of said NPN output transistor and said positive voltage conductor, and further including a second resistor and a second pair of series-connected diodes coupled in parallel between the collector of said PNP output transistor and a negative voltage conductor.

9. The complementary transistor output stage of claim 5 further including a compensating capacitor coupled between the base electrodes of said PNP output transistor and said NPN output transistor for producing a relatively large time constant at said base electrodes compared to the period of any signals applied to said input.

10. The complementary transistor output stage of claim 5 wherein said NPN output transistor is the output transistor of a first Darlington output stage having its input connected to the collector of said phototransistor, and wherein said NPN output transistor is the output transistor of a second Darlington stage having its input connected to the emitter of said phototransistor.

11. The complementary transistor output circuit of claim 2 further including a first control circuit coupled to the control electrode of said first output transistor for reducing said bias current through said first output transistor in response to an increase in said bias current through said first output transistor, and further including a second control circuit coupled to the control electrode of said second output transistor for reducing said bias current through said second output transistor in response to an increase in said bias current through said second output transistor.

12. The complementary transistor output stage of claim 1 wherein the magnitude of said bias current is selected to minimize crossover distortion of said complementary transistor output stage.

13. A method of operating a complementary transistor output circuit including a PNP output transistor and an NPN output transistor having their respective emitters connected to a common output, said output circuit including a light emitting diode and a phototransistor, said method including the steps of:
(a) producing a bias voltage difference between the base electrodes of said NPN output transistor and said PNP output transistor in order to produce a constant bias current in said NPN and PNP output transistors to reduce crossover distortion of said complementary transistor output circuit;
(b) sensing an increase in the bias current in one of said output transistors;
(c) directing a current through said light emitting diode;
(d) increasing said current through said light emitting diode in response to said increase in said bias current to increase the amount of light emitted by said light emitting diode;
(e) directing said emitted light to the base region of said phototransistor to increase the current through said phototransistor; and
(f) reducing said bias voltage in response to said increased current through said phototransistor to decrease said bias current, thereby making said complementary transistor output circuit highly resistant to thermal runaway.

14. A complementary transistor output circuit including a PNP output transistor and an NPN output transistor having their respective emitter electrodes connected to an output and their base electrodes coupled to an input comprising:
a. means coupled between the base electrodes of said PNP output transistor and said NPN output transistors, respectively, for producing a bias voltage difference between the base electrodes of said NPN output transistor and said PNP output transistor in order to produce a constant bias current in said NPN and PNP output transistors to reduce crossover distortion of said complementary transistor output circuit;
b. means coupled to the collector of one of said output transistors for sensing an increase in the bias current in said one of said output transistors;
c. a light emitting diode;
d. a phototransistor coupled between the base electrode of said PNP output transistor and said NPN output transistor, said light emitting diode and said phototransistor being packaged together to form an optical coupler; and
e. means coupled to said sensing means and to said light emitting diode for increasing the current through said light emitting diode in response to said increase in said bias current to increase the amount of light emitted by said light emitting diode, thereby increasing the current through said phototransistor and reducing said bias voltage and causing said complementary transistor output circuit to be highly resistant to thermal runaway.

15. A complementary transistor output circuit having an output and an input and comprising:
(a) a first output transistor of a first conductivity type having first and second electrodes and a control electrode;
(b) a second output transistor of a second conductivity type having first and second electrodes and a control electrode, said first electrode of said first transistor being coupled to said first electrode of said second transistor and being also coupled to said output, said input being coupled to said control electrode of both said first and second transistors; and
(c) first and second current control feedback means responsive to a bias current component flowing through said first and second output transistors, respectively, for controlling the level of said bias current component, said first and second current control feedback means each being further responsive to any output current components in said first and second output transistors, respectively, to cause the other one of said first and second current control feedback means to control said level of said bias current component in both said first and second output transistors.

* * * * *